United States Patent [19]

Yau et al.

[11] Patent Number: 4,672,580
[45] Date of Patent: Jun. 9, 1987

[54] MEMORY CELL PROVIDING SIMULTANEOUS NON-DESTRUCTIVE ACCESS TO VOLATILE AND NON-VOLATILE DATA

[75] Inventors: Robert L. Yau, Cupertino; Ron Maltiel, Mountain View, both of Calif.

[73] Assignee: Advanced Micro Devices, Inc., Sunnyvale, Calif.

[21] Appl. No.: 728,963

[22] Filed: Apr. 30, 1985

[51] Int. Cl.$^4$ .............................................. G11C 7/00
[52] U.S. Cl. .................................. 365/189; 365/185; 365/49; 365/149; 357/23.5
[58] Field of Search .............. 365/184, 185, 189, 190, 365/230, 149, 182, 228, 49; 357/23.5, 23.6

[56] References Cited

U.S. PATENT DOCUMENTS

| | | | |
|---|---|---|---|
| 4,103,348 | 7/1978 | Fagan | 365/182 |
| 4,354,255 | 10/1982 | Stewart | 365/154 |
| 4,432,072 | 2/1984 | Chao et al. | 365/185 |
| 4,435,787 | 3/1984 | Yasuoka | 365/174 |
| 4,611,309 | 9/1986 | Chuang et al. | 365/185 |

*Primary Examiner*—James W. Moffitt
*Assistant Examiner*—Glenn A. Gossage
*Attorney, Agent, or Firm*—Patrick T. King; Kenneth B. Salomon

[57] ABSTRACT

A memory cell providing separate storage of volatile and non-volatile data. The volatile and non-volatile data elements, which are not necessarily duplicative, can be non-destructively accessed within a single memory clock cycle via separate volatile and non-volatile bit lines. The cell stores volatile data by the storage of charge on a dynamic storage capacitor formed of a semiconductor device and stores non-volatile data by the storage of charge in the floating gate of a transistor. An array of the memory cells illustrates comparison of the volatile and non-volatile data elements within a single memory cycle particularly suited for pattern recognition.

22 Claims, 10 Drawing Figures

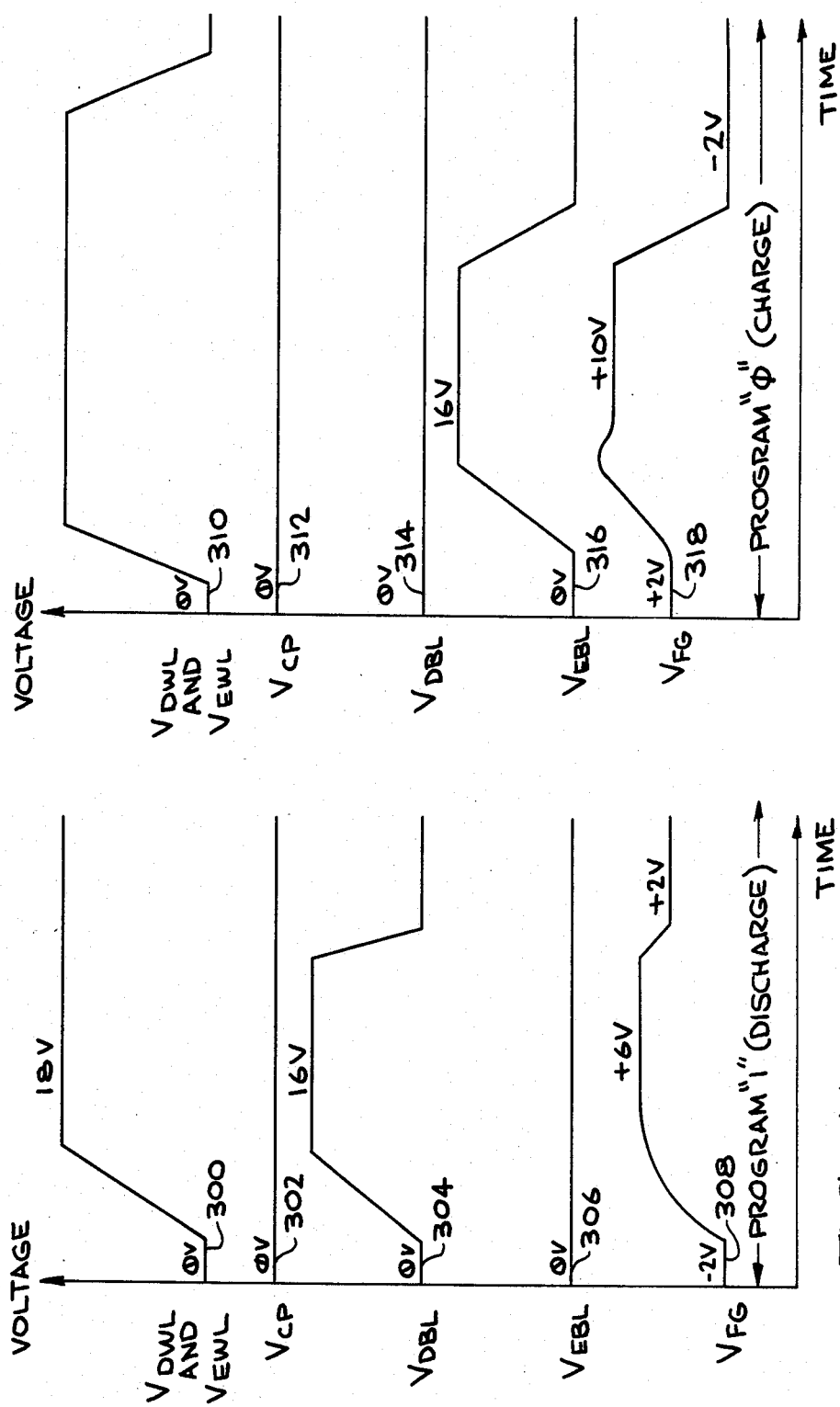

MEMORY CELL PROVIDING SIMULTANEOUS NON-DESTRUCTIVE ACCESS TO VOLATILE AND NON-VOLATILE DATA

CROSS-REFERENCE TO CO-PENDING APPLICATION

Related, co-pending application of particular interest to the present invention is U.S. patent application Ser. No. 587,086, (now abandoned) filed Mar. 7, 1984, on behalf of Ron Maltiel entitled "Single Gate Non-Volatile Memory Cell" which description is incorporated herein.

FIELD OF THE INVENTION

This invention relates to electronic memory circuits, and more particularly, to a memory cell capable both of volatile dynamic random access storage and non-volatile static read only memory storage providing non-destructive single memory-cycle reading of both the volatile and non-volatile data.

BACKGROUND OF THE INVENTION

Known in the prior art are semiconductor devices which provide volatile storage of information in a dynamic random access memory (RAM) portion and non-volatile storage in a read only memory (ROM) portion. For example, U.S. patent application Ser. No. 654,332, (now U.S. Pat. No. 4,611,309) filed Sept. 24, 1984, on behalf of Patrick Chuang, Robert Yau and Ron Maltiel, entitled "An Improved Non-Volatile Dynamic RAM Cell", assigned to the assignee of the instant application discloses one such device.

Oftentimes it is necessary to non-destructively access both the volatile and non-volatile data for such purposes as comparison in image processing and pattern recognition. It is desirable that both of these accesses take place over a short period of time, ideally within one memory clock cycle, because of the large number of data points used in such applications as image processing and pattern recognition. If each such comparison requires several clock cycles, an undesirable time penalty would be imposed during pattern recognition.

However, the memory cells of the prior art are incapable of concurrently accessing both the volatile and non-volatile data without over-writing the volatile data. In addition, in these so-called shadow-memories, the non-volatile portion merely duplicated the data stored in the volatile portion. This duplication was necessary to provide back-up for data which would be lost from the volatile portion during a power failure. Therefore, only one-half of the shadow-memory is being used, the other one-half serving as back-up. On approach overcoming these difficulties is to temporarily store the data from, for example, the volatile portion of the memory during one memory access cycle and then access the data from the non-volatile portion of the memory during the following memory cycle for subsequent comparison. Such approach is described in a co-pending application Ser. No. 717,348, filed Mar. 29, 1985, on behalf of Ron Maltiel and Robert Yau, entitled "Method and Apparatus for Non-Destructive Access of Volatile and Non-Volatile Data in a Shadow Memory Array", and assigned to the assignee of the instant application.

SUMMARY OF THE INVENTION

As mentioned, it is desirable to avoid the time penalty imposed by the use of more than a single memory cycle to non-destructively access both the volatile and non-volatile data stored within a memory cell. Accordingly, the memory cell of the present invention provides separate volatile and non-volatile input/output signal (bit) lines and separate access transistors for these bit lines which permit independent non-destructive reading of the volatile and non-volatile data within a single memory cycle.

The memory cell of the present invention provides separate storage elements for volatile and non-volatile data. The memory cell stores volatile information by the storage of charge in a dynamic storage capacitor connected to a dynamic random access memory (DRAM) bit line via a DRAM access transistor. The cell stores non-volatile information by the storage of charge in a floating gate transistor connected to a static electrically erasable programmable read only memory (EEPROM) bit line via an EEPROM access transistor. The quantum of charge stored on the floating gate indicates the value (ONE or ZERO) of the non-volatile data element.

A first portion of the floating gate forms a tunneling capacitor, a tunneling region formed between a portion of the floating gate and a conducting N+ region of the substrate permits transfer of charge into or out of the floating gate by the tunneling mechanism during writing of information to the non-volatile portion of the memory cell. A second, coupling capacitor, portion of the floating gate with an area approximately four times that of the tunneling capacitor, shares an electrode with the tunneling capacitor formed from the floating gate. The floating gate is therefore held at a voltage which is always in a fixed ratio between that of the other electrodes of the coupling and the tunneling capacitors. This property permits discharge of electrons out of the floating gate through the tunneling region upon application of a relatively high voltage at the DRAM bit line and a relatively low voltage at the EEPROM bit line, thereby writing a ONE to the non-volatile portion of the cell. Similarly, application of a relatively low voltage at the DRAM bit line and a relatively high voltage at the EEPROM bit line will cause a ZERO to be written to the non-volatile portion of the cell. Writing of information to the volatile portion of the memory cell is achieved by a conventional DRAM write operation involving a DRAM word line, the DRAM bit line and a DRAM sense amplifier.

Reading of the information written to the volatile and non-volatile portions of the memory cell is accomplished non-destructively by application of voltages to DRAM and EEPROM word lines of the cell and to a conducting plate which forms the gate of an EEPROM read transistor. This transistor isolates the positive voltage on the EEPROM bit line from the common line at ground potential during the writing operation.

The novel memory cell of the instant invention therefore provides non-destructive single memory cycle access to both the volatile and non-volatile data elements within the cell which is particularly advantageous in pattern recognition and data calibration applications. An exemplary memory array circuit employing the memory cell is provided which permits comparison of these volatile and non-volatile elements within a single memory cycle.

BRIEF DESCRIPTION OF THE DRAWINGS

FIG. 5A and 5B are timing diagram for the signals used to write data to the non-volatile portion of the memory cell of FIG. 3;

DESCRIPTION OF THE PREFERRED EMBODIMENT

Figure 1:
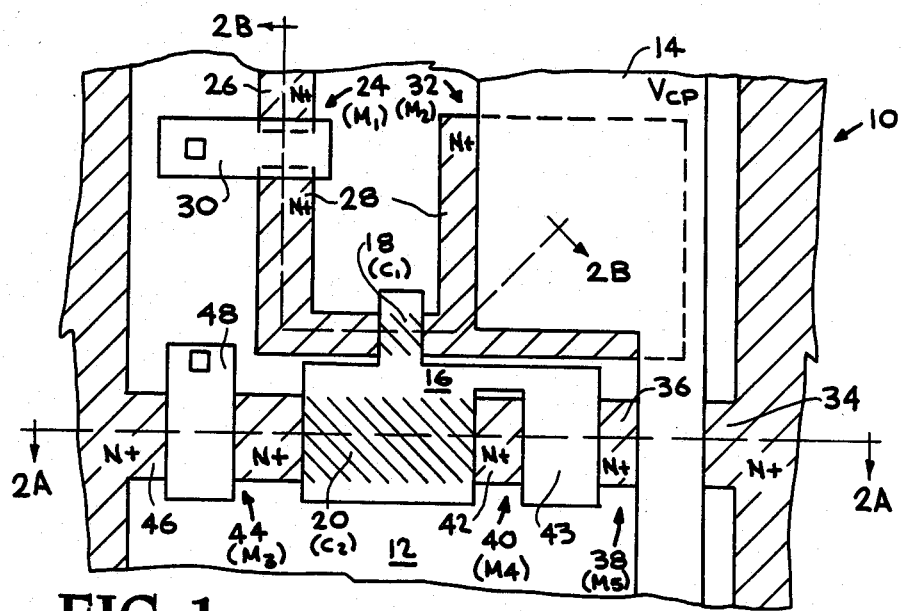
FIG. 1 is a top view of the memory cell of the present invention.

The construction of a memory cell 10 of the present invention is shown in plan of FIG. 1. The memory cell 10 utilizes a single-poly floating gate structure and is manufactured in accordance with present day MOS semiconductor technology in a lightly P-doped semiconductor substrate 12. A conducting plate 14 is formed from a conducting layer which extends above the substrate occupied by the memory cell 10. A floating gate layer 16 is electrically isolated from the conducting plate 14 and includes a portion which forms a volatile tunneling capacitor ($C_1$) 18 and a coupling capacitor ($C_2$) 20. The floating gate 16 is electrically isolated from all other regions of the memory cell 10. A heavily-doped, isolated region formed along the surface of the semiconductor substrate 12 is disposed below the single-poly floating gate layer 16 and is fully described in the co-pending commonly-assigned U.S. patent application Ser. No. 587,086, (now abandoned) filed Mar. 7, 1984, on behalf of Ron Maltiel entitled "Single Gate Non-Volatile Memory Cell" which description is incorporated herein.

A dynamic random access (volatile) memory (DRAM) access transistor ($M_1$) 24 is formed by first and second heavily-doped N+ regions 26 and 28 in the substrate 12. Together with a conducting layer 30, the N+ regions 26 and 28 form an MOS transistor. Conducting layer 30 is the gate of the transistor, while the regions 26 and 28 form first and second terminals, respectively, of the DRAM access transistor 24. A positive voltage signal ($V_{DWL}$) on the gate 30 permits the surface region of the substrate 12 below the gate 30 to become conductive so that signals can pass between the regions 26 and 28. The region 26 is also part of a DRAM input/output (I/O) line, commonly called the DRAM bit line in semiconductor device terminology.

A volatile data storage capacitor ($M_2$) 32 is formed by the second N+ region 28 and an overlying portion of the conducting plate 14, forming first and second terminals of the storage capacitor 32. Transistor ($M_1$) 24 and the volatile data storage capacitor ($M_2$) 32 share the common node 28 which is at the volatile storage voltage level ($V_{ST}$).

N+ region 28, being first terminal of storage capacitor 32, stores a quantum of charge indicating the state of the data element in the volatile portion of the memory cell 10. The quantum of charge is introduced into the volatile storage capacitor 32 via the DRAM access transistor 24 and is stored in the second N+ region 28 which is termed a storage node. The floating gate 16 stores a quantum of charge indicating the state of the data element stored in the non-volatile portion of the memory cell 10.

A third N+ region 34 and a fourth N+ region 36 in the substrate 12 form the first and second terminals, respectively, of an MOS non-volatile (EEPROM) read transistor ($M_5$) 38. The conducting layer 14 is the gate of transistor 38, and a positive signal ($V_{CP}$) applied to gate 14 of transistor 38 permits the surface region of the substrate 12 below the gate 14 to become conductive so that signals can pass between the third and fourth regions 34 and 36. The third N+ region 34 is connected to a $V_{SS}$ line which is held at ground potential.

A floating gate transistor ($M_4$) 40 is formed by the fourth N+ region 36 and a fifth N+ region 42 in the substrate 12. Together with a portion 43 of floating gate 16 which is the gate of transistor 40, N+ regions 36 and 42 form an MOS transistor. A positive voltage signal ($V_{FG}$) on the floating gate 16, permits the surface region of the substrate 12 below the gate 43 to become conductive so that signals can pass between the fourth and fifth regions 36 and 42.

The tunneling capacitor ($C_1$) 18 is formed by the portion of floating gate 16 overlying the second N+ region 28 while the coupling capacitor ($C_2$) 20 is formed from the fifth N+ region 42 and the portion of floating gate 16 overlying the fifth N+ region 42.

The tunneling capacitor $C_1$ is formed by the portion 18 of floating gate 16 which is approximately one-fourth in area that of portion 20 of floating gate 16 forming the coupling capacitor $C_2$. The regions below portions 18 and 20 of floating gate 16 are much closer to the substrate 12 than other regions of the floating gate 16, as will be described in connection with the cross-sections of unitary FIG. 2, below. These regions of the lower surface of the floating gate 16 closely disposed over the regions 28 and 42 are termed the tunneling and coupling regions, respectively, of the floating gate 16 formed of tunnel oxide, approximately 100 Angstroms in thickness. Since the coupling capacitor ($C_2$) is of four times greater area than that of the tunneling capacitor ($C_1$), its capacitance is also four times as great, and thus the voltage on the floating gate 16 ($V_{FG}$) will be held closer to the voltage ($V_E$) of the fifth N+ region 42 than to the voltage ($V_{ST}$) of the second N+ region 32.

A non-volatile (EEPROM) access transistor ($M_3$) 44 is formed by the fifth N+ region 42 and a sixth N+ region 46 in the substrate 12. Together with a conducting layer 48, the N+ regions 42 and 46 form an MOS transistor. The conducting layer 48 is the gate of the transistor, while the regions 42 and 46 form the first and second terminals of the non-volatile access transistor 44. A positive voltage ($V_{EWL}$) on the gate 48 permits the surface region of the substrate 12 below the gate 48 to become conductive so that signals can pass between the fifth and sixth regions 42 and 46. The sixth region 46 is also part of an EEPROM input/output (I/O) bit line.

Figure 2A:
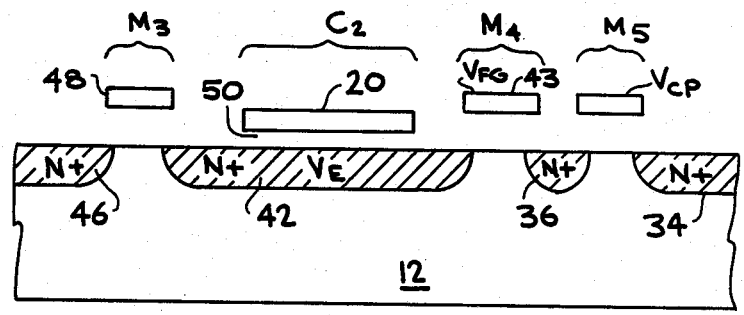
FIG. 2A is a cross-sectional view along line 2A—2A of the memory cell of the present invention.
Figure 2B:
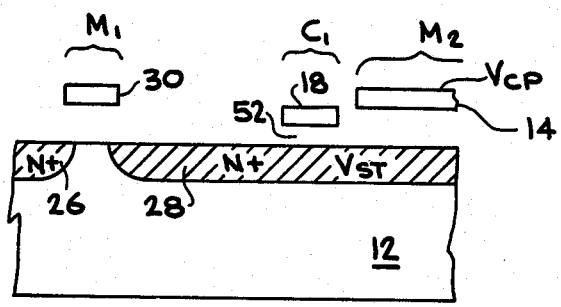
FIG. 2B is a cross-sectional view along line 2B—2B of the memory cell of the present invention.

Some of the elements described above in connection with FIG. 1, are shown in a cross-sectional view along line 2A—2A, in FIG. 2A; the remaining elements are shown in a cross-sectional view along line 2B—2B, in FIG. 2B. As shown in FIG. 2B, the floating gate 16 includes the so-called tunneling capacitor ($C_1$) area where the floating gate 16 is much closer to the N+ region 28 than other levels of the floating gate. A tunneling layer 52 is disposed between the tunneling region 18 of the floating gate 16 and the upper surface of the second N+ region 28. Under appropriate biasing conditions between the floating gate 16 and the second N+ region 28, electrons may tunnel through the tunneling region 52 to charge or discharge the floating gate 16.

As shown in FIG. 2A, the floating gate 16 includes the so-called coupling capacitor ($C_2$) area where the floating gate 16 is much closer to the N+ region 42 of the substrate 12 than other levels of the floating gate 16. A thin oxide layer, termed a coupling layer 50, is disposed between the floating gate 16 and the upper surface of the fifth N+ region 42. Since the capacitance of coupling capacitor $C_2$ is four times as great as that of tunneling capacitor $C_1$, $V_{FG}$ is held very close to the voltage $V_E$ of N+ region 42. Accordingly, there is no tunneling of charge in the region occupied by the coupling capacitor $C_2$.

Figure 3:
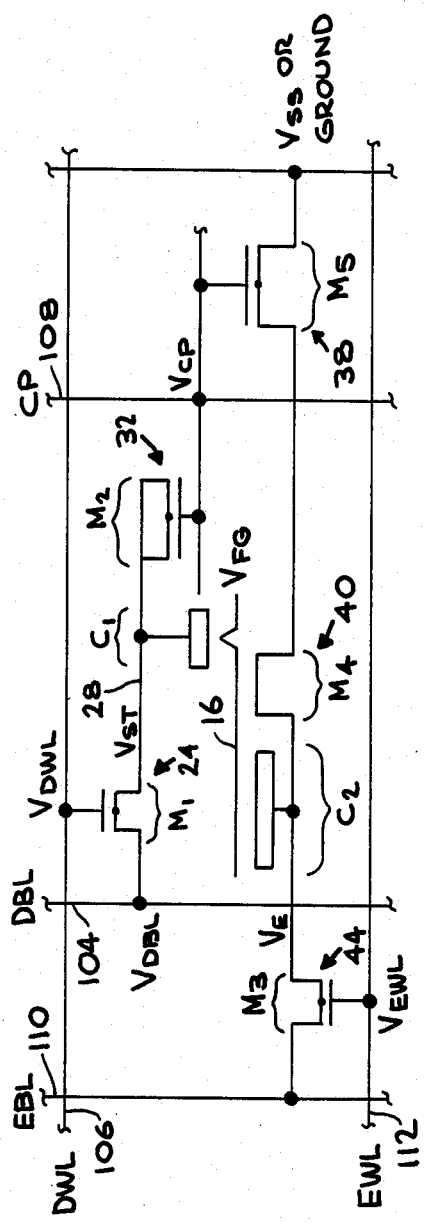
FIG. 3 is a schematic representation of the memory cell of the instant invention.

FIG. 3 is a schematic diagram of the memory cell 10 of the present invention. The tunneling capacitor, $C_1$, is formed by two electrodes, where the bottom electrode is connected to the first terminal of capacitor ($M_2$) 32, the second N+ region 28 and the top electrode is the portion 18 of the floating gate 16. The tunneling capacitor $C_1$ is coupled to a (volatile) DRAM bit line (DBL) 104 via the DRAM access transistor ($M_1$) 24. When a DRAM access signal is present on the DRAM word line (DWL) 106, which controls the gate 30 of the DRAM access transistor 42, the storage capacitor $C_1$ is coupled to the DBL 104. The conducting plate 14 is connected to a CP control line 108. The voltage ($V_{CP}$) on the CP control line 108 controls and the conductivity of the EEPROM read transistor ($M_5$) 38. $V_{CP}$ is normally at ground potential except during a non-volatile read operation when $V_{CP}$ is set at 2.5 volts thereby causing EEPROM read transistor 38 to become conductive.

The coupling capacitor, $C_2$, is formed by two electrodes, where the bottom electrode is the fifth N+ region 42 and the top electrode is the portion 20 of the floating gate 16. This capacitor $C_2$ is coupled to an EEPROM (non-volatile) bit line (EBL) 110 via the EEPROM access transistor ($M_3$) 44. When an EEPROM access signal is present on an EEPROM word line (EWL) 112, which controls the gate 48 of the EEPROM access transistor 44, the coupling capacitor $C_2$ is coupled to the EBL 110. The floating gate transistor ($M_4$) 40 is formed between the fourth and fifth N+ regions 36 and 42 with the voltage level, $V_{FG}$, on the floating gate 16 controlling the conductivity of the floating gate transistor 40.

DRAM capacitor ($M_2$) 32 acts as a storage element for volatile data. For a digital "ONE", 5 volts is stored between the voltage of N+ region 28 "storage node" ($V_{ST}$) and $V_{CP}$, for a digital "ZERO" 0 volts is stored between $V_{ST}$ and $V_{CP}$. During reading of volatile data, the digital "ONE" is represented as $V_{DBL} = +5$ volts on the DBL 104 and a "ZERO" as $V_{DBL} = 0$ volts thereon. Transistor ($M_4$) 40 is storage element for the non-volatile E²PROM data, a digital ONE is represented by positive voltage at $V_{FG}$ of approximately +2 volts, whereas ZERO is represented by negative voltage of $V_{FG}$ of approximately $-2$ volts. During reading of non-volatile data, the digital "ONE" is represented as $V_{EBL} = 0$ volts thereon. This inversion of the non-volatile data when compared with the volatile data must be taken into account.

Figure 4:
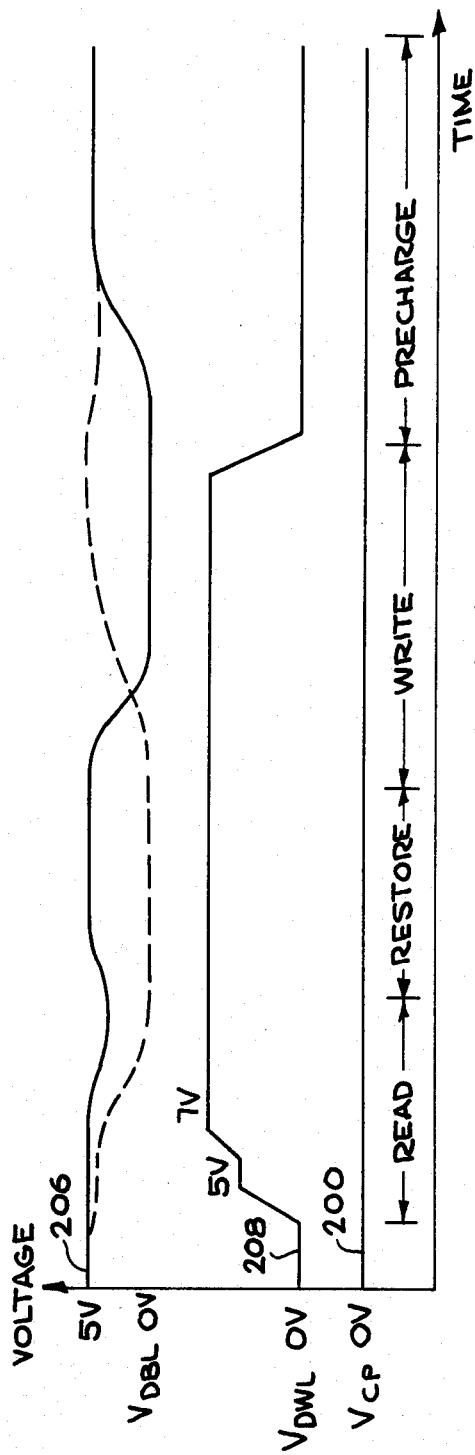
FIG. 4 is a timing diagram for the signals used to access the volatile portion of the memory cell of FIG. 3.

The steps necessary to read and write volatile (DRAM) data from the memory cell 10 of the present invention will be described in connection with FIG. 4. The CP voltage $V_{CP}$ is held to 0 volts throughout access to the volatile (DRAM) data, as shown on the voltage vs. time waveform 200 of FIG. 4. This assures that transistor ($M_5$) 38 is non-conducting, since the gate of transistor 38 is connected to CP 14. $V_{DBL}$ is initially set to 5 volts as shown in waveform 206 and $V_{DW}$ is initially set to 0 volts as shown in waveform 208.

To read volatile data, $V_{DWL}$ is pulled to 7 volts as shown in waveform 208. As set forth above, this causes DRAM access transistor 24 to conduct and a maximum charge transfer will occur between the first and second (storage node 28) terminals of transistor 24 as the voltage at gate 30 approaches 7 volts. If the voltage, $V_{ST}$, as storage node 28 was 5 volts, i.e., a ONE was stored, the voltage $V_{DBL}$ will remain essentially unchanged, as shown in the solid line of waveform 206. However if the voltage $V_{ST}$ at storage node 28 was 0 volts, i.e., a ZERO was stored, the voltage $V_{DBL}$ will decay to 0 volts after sensing, as shown in the dashed line of waveform 206.

To write volatile data, $V_{DWL}$ is pulled to 7 volts, as shown in waveform 208 which causes access transistor 24 to conduct. Therefore, by applying either 5 volts for $V_{DBL}$ or 0 volts for $V_{DBL}$, the volatile storage capacitor transistor 32 will be charged to either 5 volts, thereby storing a ONE, as shown in the upper dashed portion of waveform 206, or storing a ZERO, as shown in the lower solid portion of waveform 206, respectively.

The steps necessary to write non-volatile (EEPROM) data to the memory cell 10 of the present invention will be described in connection with unitary FIG. 5. The floating gate 16 can be placed in either a "charged" or "discharged" state to represent either the storage of a ZERO or a ONE, respectively. As set forth above, a ONE is stored on the floating gate 16 by causing electrons to tunnel from the floating gate 16 to the N+ region 28. Thus a positive voltage on the floating gate 16 represents storage of a ONE, a negative voltage representing storage of a ZERO.

A ONE can be written to the non-volatile portion of memory cell 10 by application of the voltages shown in the waveforms of FIG. 5A. Initially all of the $V_{DWL}$ and $V_{EWL}$, $V_{CP}$, $V_{DBL}$, and $V_{EBL}$ are at 0 volts, as shown in waveforms 300, 302, 304 and 306, respectively. $V_{DBL}$ is pulled to 16 volts while $V_{EBL}$ is held at 0 volts as shown in waveforms 304 and 306, respectively, Also $V_{DWL}$ and $V_{EWL}$ are pulled to 18 volts as shown in waveform 300. This causes access transistors 24 ($M_1$) and 44 ($M_3$) to become fully conducting. With $V_{DBL}$ at 16 volts and $V_{EBL}$ at 0 volts, the voltage of storage node 28 ($V_{ST}$) with respect to the voltage at storage node 42 ($V_E$) will be approximately 16 volts. Since the capacitance of $C_2$ is approximately four times that of $C_1$, as described earlier, the voltage of the floating gate ($V_{FG}$) 16 intermediate between $V_{ST}$ and $V_E$, which is the point of commonality between $C_1$ and $C_2$, will initially be at approximately 4 volts. Since this results in a relatively large voltage of 12 volts across $C_1$, electrons will be discharged from the floating gate 16 through the tunneling area 52 to the storage node 28, leaving $V_{FG}$ approximately 6 volts positive, as shown in waveform 308, $V_{FG}$ couples to approximately 2 volts positive upon return of $V_{DBL}$ to 0 volts.

A ZERO can be written to the non-volatile portion of memory cell 10 by the application of the voltages shown in the waveforms of FIG. 5B. Initially, all of $V_{DWL}$ and $V_{EWL}$, $V_{CP}$, $V_{DBL}$ and $V_{EBL}$, are at 0 volts, as shown in waveforms 310, 312, 314 and 316, respectively. $V_{EBL}$ is pulled to 16 volts while $V_{DBL}$ is held to 0 volts as shown in waveforms 306 and 304, respectively. Also $V_{DWL}$ and $V_{EWL}$ are pulled to 18 volts as shown in waveform 310. This causes access transistors 24 ($M_1$) and 44 ($M_3$) to become fully conducting because their gates 30 and 48 are at strongly positive voltages. With $V_{EBL}$ at 16 volts and $V_{DBL}$ at 0 volts, the voltage of storage node 28 ($V_{ST}$) is held at 0 volts, while that of storage node 42 ($V_E$) will be approximately 16 volts. As described above in connection with writing a ONE to the non-volatile portion of memory cell 10, $V_{FG}$ will rise to approximately 12 volts with respect to $V_{ST}$. This will cause electrons to charge into the floating gate 16 through the tunneling area 52, leaving $V_{FG}$ approximately −2 volts upon return of $V_{EBL}$ to 0 volts, as shown in waveform 318.

To read data from the non-volatile portion of memory cell 10, voltage waveforms shown in unitary FIG. 6 are applied. As described above, the floating gate 16 will be either at a positive voltage, indicating storage of a ONE and the resulting conductivity of transistor ($M_4$) 40 or at a negative voltage, indicating storage of a ZERO and the resulting non-conductivity of transistor ($M_4$) 40. Reading of EEPROM data is generally accomplished by pulling $V_{CP}$ to approximately 2.5 volts which causes transistor $M_5$ 38 to become conductive. Therefore, providing a discharge path to ground for the voltage $V_{EBL}$ on the EBL 110 depending on the state of conductivity of transistor ($M_4$) 40, as will now be described.

Figures 6A, 6B:
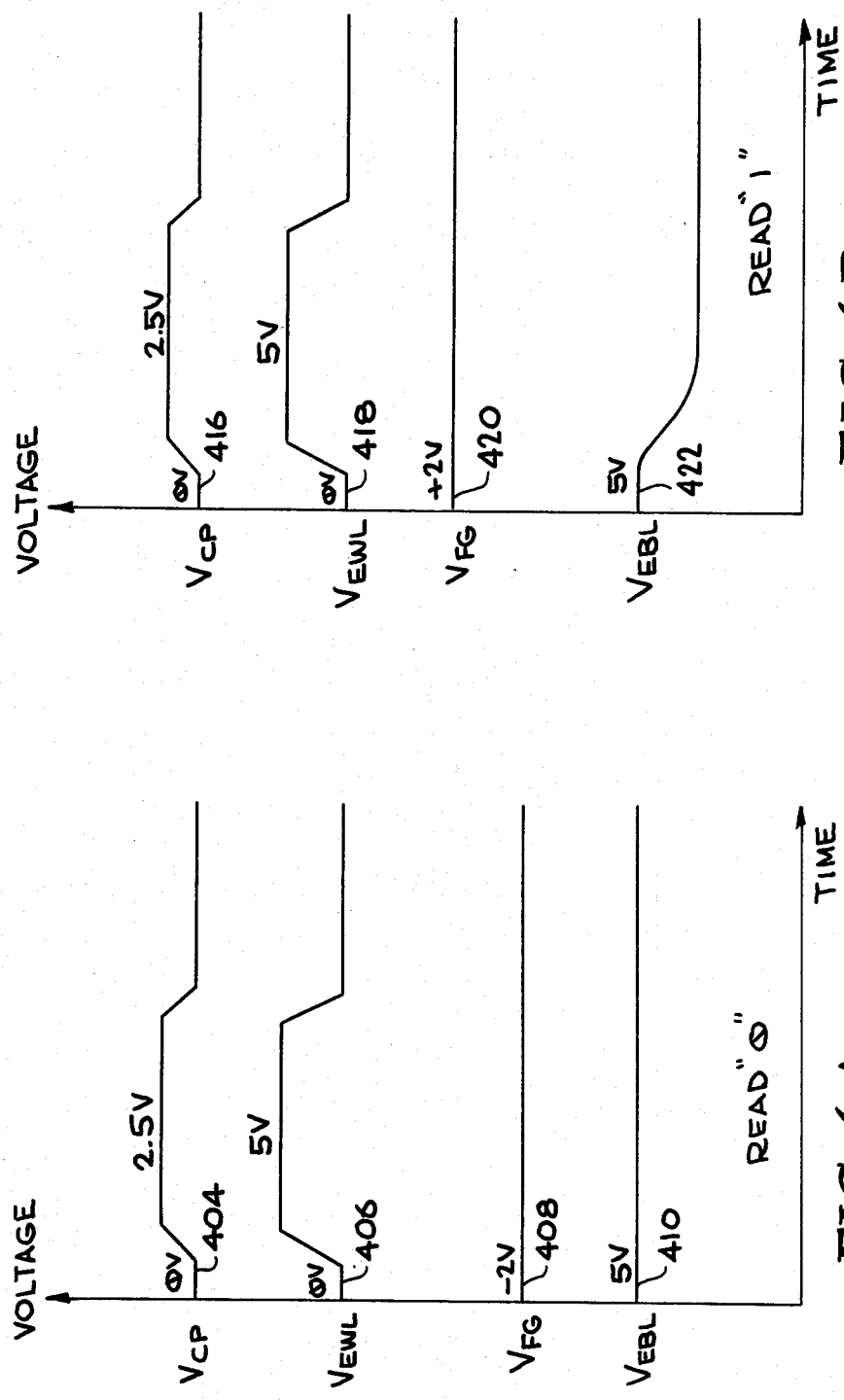
FIG. 6A and 6B are timing diagrams of the signals used to read data from the non-volatile portion of the memory cell of FIG. 3.

As shown in FIG. 6A, a ZERO is read from the non-volatile portion of memory cell 10 by pulling $V_{CP}$ to 2.5 volts as shown in waveform 404. This causes non-volatile (EEPROM) read transistor ($M_5$) 38 to become conductive. Pulling $V_{EWL}$ to 5 volts as shown in waveform 406 sets EEPROM access transistor 44 conductive. $V_{EBL}$ is initially precharged to 5 volts as shown in waveform 410. Since floating gate is negatively charged, $V_{FG}$ is negative, at approximately −2 volts, and transistor ($M_4$) 40 is thus non-conductive, $V_{EBL}$ will remain at 5 volts, as shown in waveform 410. However if floating gate 16 is positively charged, $V_{FG}$ is positive, representing storage of a ONE on the floating gate, then as shown in waveform 420 of FIG. 6B, $V_{FG}$ is approximately +2 volts. Thus transistor ($M_4$) 40 is conductive and $V_{EBL}$ will decay to 0 volts when EEPROM access transistor 44 is set conductive when $V_{EWL}$ is set to 5.0 volts (waveform 418) as shown in waveform 422. Accordingly, the voltage on line EBL 110, $V_{EBL}$, will represent the non-volatile data stored within memory cell 10.

Figure 7:
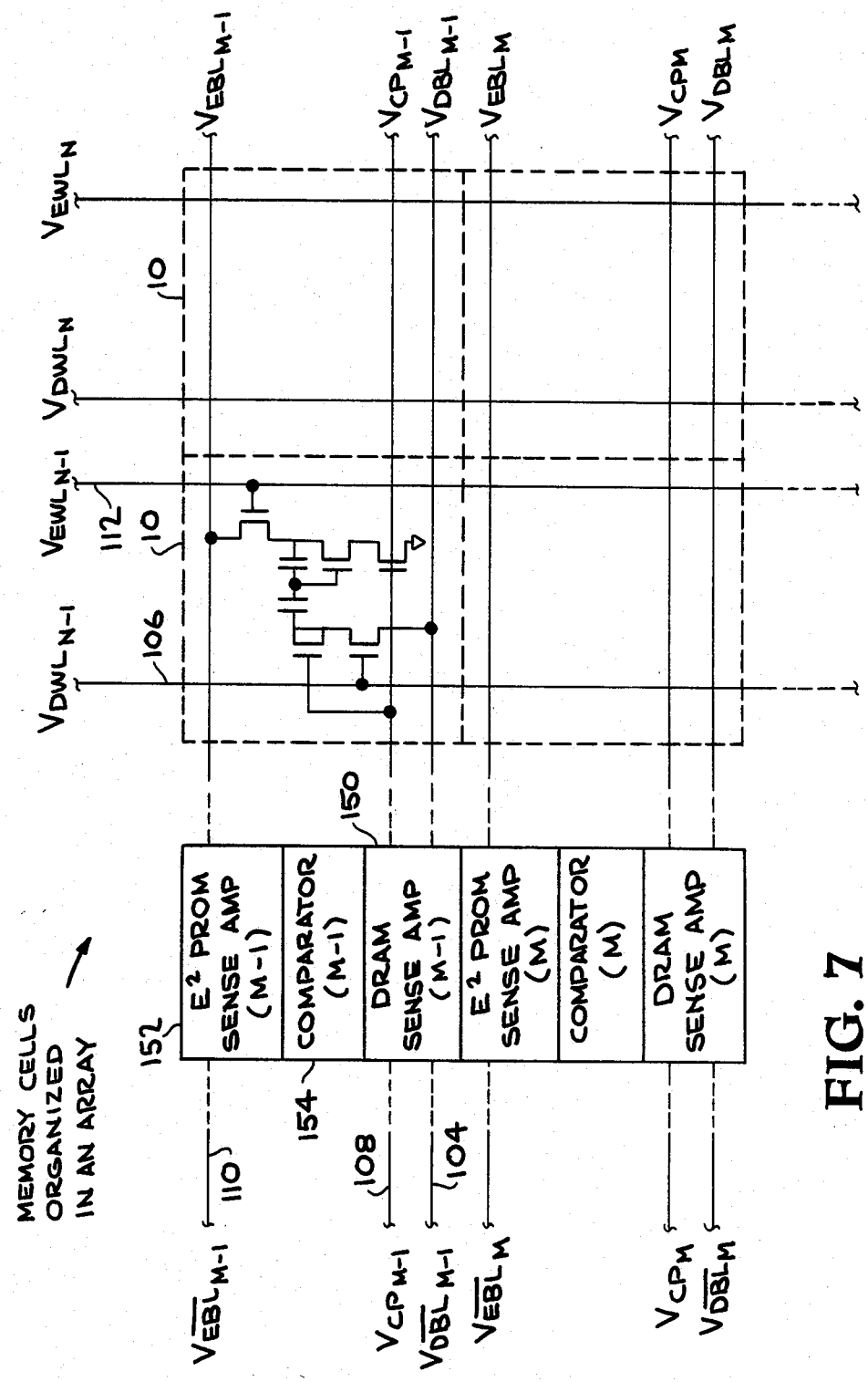
FIG. 7 is a schematic representation of a memory array utilizing the memory cell of FIG. 3.

FIG. 7 illustrates a memory circuit which utilizes the novel memory cell 10 of the present invention. The memory circuit is part of a non-volatile dynamic RAM (NVDRAM) circuit which affords storage of data in the volatile dynamic RAM portion of each cell 10 or storage in the non-volatile EEPROM memory portion of each cell 10. For purposes of understanding the invention, the same reference numerals are used in the drawings wherever possible.

The circuit depicted in FIG. 7 is a rectangular array of memory cells 10 arranged in rows and columns where a column of memory cells 10 is connected to an EEPROM (static) bit line (EBL) 110 and to a DRAM (volatile) bit line 104 (DBL). Selection of these bit lines is performed by conventional address decoding means (not shown) as will be understood by those skilled in the art. Similarly, each row of memory cells 10 is connected to an EEPROM word line (EWL) 112 and a DRAM word line (DWL) 106, word selection performed by conventional address decoding means (not shown). The circuit also includes a control line 108 for controlling the voltage level on the conducting plate (CP) 14 portion of the memory cell 10; selection of the CP control line 108 is similarly performed by conventional address decoding means (not shown).

Reading and writing of volatile and non-volatile data to each memory cell 10 within the array illustrated in FIG. 7 is accomplished in the manner described above in connection with FIGS. 4, 5 and 6. Since independent access to the volatile and non-volatile data within each cell is available with the memory cell 10 of the present invention, a comparison such as needed in pattern recognition applications of the volatile and non-volatile data can be done within a single memory cycle. To affect this comparison, a DRAM sense amplifier 150 is connected to each DRAM bit line 104, an EEPROM sense amplifier 152 is connected to each EEPROM bit line 110 and a comparator 154 receives the amplified signal from sense amplifiers 150 and 152, for each row in the array of memory cells 10. The circuitry comparison reflecting the above-mentioned inversion of non-volatile data with respect to volatile data. The design and construction of the sense amplifiers 150 and 152 and comparators 154 are conventional and will accordingly not be described herein. The various enable signals used to control these elements of the array of memory cells shown in FIG. 7 are likewise conventional as will be appreciated by those skilled in the art and are accordingly neither shown nor described herein.

The foregoing is a detailed description of a preferred embodiment of the invention. It is understood by persons of ordinary skill in the art that alternative processes of circuits and materials may be substituted for many of the processes, circuits, and materials described above to perform substantially the same functions in the same manner. For example, the conductivity states of the substrate and buried region may be reversed. Or the use of negative logic rather than the positive logic used to illustrate the reading, writing and storage capabilities of the memory cell of the present invention. Additionally, the geometric layout of the control lines in the memory circuit may be altered. Furthermore, while the memory cell of the present invention has been described above in terms of a single-polysilicon floating gate embodiment for the non-volatile portion of the cell, a stacked gate double-polysilicon construction could be used therefore, such as that fully described in the copending, commonly assigned U.S. patent application Ser. No. 654,332 (now U.S. Pat. No. 4,611,309) entitled "An Improved Non-Volatile Dynamic RAM Cell" filed Sept. 24, 1984 on behalf of Patrick Chuang, Robert Yau and Ran Maltiel and assigned to the assignee of the instant invention. Accordingly, the full scope of the present invention is defined by the appended claims.

We claim:

1. A memory cell capable of storing separate data elements in a volatile and non-volatile portion thereof, said data elements not necessarily duplicative, having first and second input/output (I/O) bit lines and a common line held at ground potential, comprising:

volatile access and storage means connected to said first I/O bit line responsive to first read and first write enable signals for receiving on said first I/O bit line signals indicative of the state of a volatile signal thereon upon reception of said first write enable signal, for storing said state of said volatile signal, and for generating on said first I/O bit line a signal indicative of the state of said stored signal upon reception of said first read enable signal; and non-volatile access and storage means connected to said second I/O bit line responsive to second read and second write enable signals for receiving on said second I/O bit line signals indicative of the state of a non-volatile signal thereon upon reception of said second write enable signal, for storing said state of said non-volatile signal, and for generating on said second I/O bit line a signal indicative of the state of said stored signal upon reception of said second read enable signal, whereby said volatile and non-volatile data elements may be non-destructively read from, or written to and stored within said volatile access and storage means, and said non-volatile access and storage means, respectively independently within a single memory cycle.

2. A memory cell according to claim 1 further including a conductive capacitor plate and a floating gate, wherein said volatile access and storage means comprises:

a volatile access transistor having a first terminal connected to said first I/O bit line, a second terminal, and having an access control gate for coupling said first terminal to said second terminal responsive to said first read and first write enable signals during respective read and write operations;

a volatile storage capacitor having a first electrode connected to said second terminal of said access transistor, and a second electrode being a first portion of said capacitor plate; and a tunneling capacitor having a first electrode connected to said first electrode of said volatile storage capacitor and a second electrode being a first portion of said floating gate.

3. A memory cell according to claim 2 wherein said terminals of said volatile access transistor and said first electrode of said volatile storage capacitors are isolated N+ regions formed along the surface of a P-monocrystalline silicon substrate.

4. A memory cell according to claim 3 wherein said second terminal of said volatile access transistor and said first electrode of said volatile storage capacitor are formed by a first isolated N+ region termed a dynamic "storage node".

5. A memory cell according to claim 4 wherein said floating gate is an isolated polysilicon layer disposed above the surface of said substrate, said second tunneling capacitor electrode forming a region on a surface of said first floating gate portion, termed a "tunneling region", disposed in close proximity to said volatile storage node which forms said first tunneling capacitor electrode.

6. A memory cell according to claim 5 further including a tunneling oxide layer disposed between said tunneling region and a surface of said volatile storage node, whereby a volatile data element may be stored by controlling the charge stored on the volatile storage capacitor.

7. A memory cell according to claim 1 further including a conductive capacitor plate, wherein said non-volatile access and storage means comprises:

a non-volatile access transistor having a first terminal connected to said second I/O bit line, a second terminal, and having an access control gate for coupling said first terminal to said second terminal responsive to said second read and second write enable signals during respective read and write operations;

a floating gate transistor having a first terminal connected to said second terminal of said access transistor, a second terminal and a gate being a portion of said floating gate;

a coupling capacitor having a first electrode connected to said first terminal of said floating gate transistor and a second electrode being a second portion of said floating gate; and a non-volatile read transistor having a first terminal connected to said second terminal of said floating gate transistor, a second terminal connected to said common line, and a gate being a portion of said capacitor plate.

8. A memory cell according to claim 7 wherein said terminals of said non-volatile access and floating gate transistors are isolated N+ regions formed along the surface of a P-monocrystalline silicon substrate.

9. A memory cell according to claim 8 wherein said second terminal of said access transistor and said first terminal of said non-volatile storage transistor are formed by a first isolated N+ region termed a non-volatile "storage node".

10. A memory cell according to claim 9 wherein said floating gate is an isolated polysilicon layer disposed above the surface of said substrate, said first coupling capacitor electrode forming a region on a surface of said second floating gate portion, termed a "coupling region", disposed in close proximity to said non-volatile storage node which forms said second coupling capacitor electrode.

11. A memory cell according to claim 10 further including a tunneling oxide layer disposed between said tunneling region and a surface of said volatile storage node, whereby a non-volatile data element may be stored by the charge stored on said floating gate.

12. A memory cell according to claim 1 further including a conductive capacitor plate and a floating gate wherein said volatile access and storage means comprises:

a volatile access transistor having a first terminal connected to said first I/O bit line, a second terminal, and having an access control gate for coupling said first terminal to said second terminal responsive to said first read and first write enable signals during respective read and write operations;

a volatile storage capacitor having a first electrode connected to said second terminal of said volatile access transistor, and a second electrode being a first portion of said capacitor plate; and a tunneling capacitor having a first electrode connected to said first electrode of said volatile storage capacitor and a second electrode being a first portion of said floating gate, and wherein said non-volatile access and storage means comprises:

a non-volatile access transistor having a first terminal connected to said second I/O bit line, a second terminal, and having an access control gate for coupling said first terminal to said second terminal responsive to said second read and second write enable signals during respective read and write operations;

a floating gate transistor having a first terminal connected to said second terminal of said non-volatile access transistor, a second terminal and a gate being a portion of said floating gate;

a coupling capacitor having a first electrode connected to said first terminal of said floating gate transistor and a second electrode being a second portion of said floating gate; and a non-volatile read transistor having a first terminal connected to said second terminal of said floating gate transistor, a second terminal connected to said common line, and a gate being a second portion of said capacitor plate.

13. A memory cell according to claim 12 wherein said second portion of said floating gate, which forms said first electrode of said coupling capacitor, has an area about four times that of said first portion of said floating gate, which forms said second electrode of said tunneling capacitor.

14. Memory apparatus providing access and storage of volatile and non-volatile data elements, said elements not necessarily duplicative, within a single memory cycle comprising:

addressing means for generating signals on a plurality of word lines and on a plurality of bit lines and a plurality of capacitor plate (CP) lines;

a plurality of memory cell means arranged into an array having rows and columns, one of said memory cell means located at the intersection of each said row with each said column, said means having a first and a second word line connected to said addressing means, a first and a second input/output (I/O) bit line and a CP line;

a plurality of volatile data sensing means, one for each said row connected to said first I/O bit line;

a plurality of non-volatile sensing means, one for each said row connected to said second I/O bit line; and a plurality of comparator means, one for each said row connected to said non-volatile sensing means and said volatile sensing means in said row.

15. A memory cell capable of independently storing data in a volatile and a non-volatile portion thereof, said data not necessarily duplicative, having a first and a second input/output (I/O) bit line and a common line held at ground potential, comprising:

a floating gate having at least first and second planar portions;

a tunneling capacitor having a first and a second electrode which forms said first floating gate portion;

a first semiconductor device for storing a quantum of charge indicative of said volatile data state;

a coupling capacitor having a first electrode which forms said second floating gate portion and a second electrode;

a second semiconductor device for storing a quantum of charge indicative of said non-volatile data state;

means responsive to first read and first write enable signals during respective read and write operations for transferring volatile data between said first input/output (I/O) bit line and said tunneling capacitor; and means responsive to second read and second write enable signals during respective read and write operations for transferring non-volatile data between said second input/output (I/O) bit line and said coupling capacitor;

whereby volatile and non-volatile data elements may be independently read from, or written to and stored within, said first semiconductor device and said second semiconductor device, respectively, within a single memory cycle.

16. A memory cell according to claim 15 further including a conductive capacitor plate, wherein said volatile data transfer means comprises:

a volatile access transistor having a first terminal connected to said first input/output (I/O) bit line, a second terminal, and having an access control gate for coupling said first terminal to said second terminal responsive to said first read and first write signals during respective read and write operations; and a tunneling structure for charging and discharging said first floating gate portion;

and wherein said first semiconductor device comprises a volatile storage capacitor having a first electrode connected to said second terminal of said volatile access transistor, and a second electrode being a first portion of said capacitor plate; said second electrode of said volatile storage capacitor and said floating gate first portion forming said tunneling capacitor; whereupon reception of said first write enable signal causes said volatile access transistor to become conducting and said volatile storage capacitor and said volatile access transistor to tunnel electrons between said floating gate first portion and said first terminal of said volatile access transistor to adjust the quantum of charge stored on said first floating gate portion to correspond to the data on said first input/output (I/O) bit line.

17. A memory cell according to claim 16 wherein said non-volatile data transfer means comprises:

a non-volatile access transistor having a first terminal connected to said second input/output (I/O) bit line, a second terminal, and having an access control gate for coupling said first terminal to said second terminal responsive to said second read and second write signals during respective read and write operations; and a coupling structure for charging and discharging said second floating gate portion;

wherein said second semiconductor comprises a floating gate transistor having a first terminal connected to said second terminal of said static access transistor, a second terminal and a gate being a portion of said floating gate; said second terminal of said floating gate transistor and said floating gate second portion forming said coupling capacitor; whereupon reception of said second write enable signal causes said floating gate transistor and said non-volatile access transistor to tunnel electrons between said floating gate second portion and said first terminal of said non-volatile access transistor to adjust the quantum of charge stored on said second floating gate portion to correspond to data on said second input/output (I/O) bit line.

18. A memory cell according to claim 17 wherein said second terminal of said volatile access transistor and said first electrode of said volatile storage capacitor are formed by a first isolated N+ region, termed a "volatile storage node" and wherein said first terminal of said non-volatile access transistor and said second terminal of said floating gate transistor are formed by a second isolated N+ region, termed a "non-volatile storage node", and wherein said tunneling structure includes a tunneling region on a surface of said floating gate corresponding to said first portion thereof disposed over said volatile storage node for charging and discharging said floating gate first portion, and said tunneling structure includes a coupling region on a surface of said floating gate corresponding to said second portion thereof disposed over said non-volatile storage node for coupling said floating gate second portion, whereupon reception of said second write enable signal causes said volatile and non-volatile access transistors to become conducting and causing electrons to tunnel between said floating gate and said second terminal of said volatile access transistor to adjust the quantum of charge stored on said floating gate first and said second portion to correspond to the data on said second input/output (I/O) bit line.

19. A memory cell according to claim 18 wherein said second floating gate portion has an area about four times that of said first floating gate portion, whereby, upon application of a voltage on said second input/output (I/O) bit line, said floating gate will be at a voltage closer to that of said non-volatile storage node than to that of said volatile storage node.

20. A method for independently accessing volatile and non-volatile data elements within a single memory cycle in a memory cell having a first and a second input/output (I/O) bit line, a first and a second word line, a floating gate, a conductive capacitor plate, a volatile and a non-volatile storage node, with the state of the volatile data element determined by the voltage level, $V_{ST}$, on the volatile storage node, and the state of the non-volatile data element determined by the voltage level, $V_{FG}$, on said floating gate, said method comprising the steps of:
 (a) initializing the voltage level on said volatile storage node, $V_{ST}$, to a first value and on said non-volatile storage node, $V_E$, to a second value;
 (b) applying on said capacitor plate a voltage level equal to a third value;
 (c) applying on said first word line a voltage level equal to a fourth value;
 (d) sensing the voltage level on said first input/output (I/O) bit line indicative of the state of said volatile data element;
 (e) applying on said capacitor plate a voltage level equal to a fifth value and to said second word line a voltage level equal to said fourth value; and
 (f) sensing the voltage level on said second input/output (I/O) bit line indicative of the state of said non-volatile data element.

21. The volatile and non-volatile accessing method according to claim 20 further including a method of storing a volatile data element comprising the steps of:
 (g) initializing the voltage level on said volatile storage node, $V_{ST}$;
 (h) applying on said capacitor plate a voltage equal to said third value;
 (i) applying on said first word line a voltage level equal to said fourth value; and
 (j) applying on said first input/output (I/O) bit line a voltage indicative of the state of said volatile data element to be stored.

22. The volatile and non-volatile accessing method according to claim 20 further including a method of storing a non-volatile data element comprising the steps of:
 (k) initializing the voltage level on said floating gate, $V_{FG}$;
 (l) applying on said capacitor plate a voltage level equal to said third value;
 (m) applying on said first and said second word lines a voltage level equal to a fourth value; and
 (n) applying on said first input/output (I/O) bit line a voltage level equal to a sixth value and to said second input/output (I/O) bit line a voltage level equal to said third value indicative of said non-volatile data element being of a first state or applying on said first I/O bit line a voltage level equal to said third value and to said second I/O bit line a voltage level equal to said sixth value indicative of said non-volatile data element being of a second state.

* * * * *